(12) United States Patent
Xu et al.

(10) Patent No.: US 7,658,632 B2
(45) Date of Patent: Feb. 9, 2010

(54) ELECTRICAL CONNECTOR

(75) Inventors: Zhan-Jun Xu, ShenZhen (CN); Fu-Jin Peng, ShenZhen (CN); Ming-Yong Chen, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/810,251

(22) Filed: Jun. 5, 2007

(65) Prior Publication Data
US 2007/0281534 A1 Dec. 6, 2007

(30) Foreign Application Priority Data
Jun. 5, 2006 (TW) .............................. 95209735 U

(51) Int. Cl.
*H01R 13/62* (2006.01)
(52) U.S. Cl. ...................................... 439/331; 439/342
(58) Field of Classification Search ................. 439/331, 439/342, 886
See application file for complete search history.

(56) References Cited

U.S. PATENT DOCUMENTS

| | | | | |
|---|---|---|---|---|
| 4,207,586 A | * | 6/1980 | Lebailly | 257/79 |
| 4,794,053 A | * | 12/1988 | Tustison | 428/627 |
| 6,323,131 B1 | * | 11/2001 | Obeng et al. | 438/687 |
| 6,647,834 B2 | * | 11/2003 | Hu | 81/119 |
| 6,858,322 B2 | * | 2/2005 | Carey et al. | 428/648 |
| 7,025,603 B2 | * | 4/2006 | Ma | 439/73 |
| 7,118,387 B2 | * | 10/2006 | Wong | 439/73 |
| 7,205,228 B2 | * | 4/2007 | Padhi et al. | 438/652 |
| 7,429,182 B1 | * | 9/2008 | Zheng et al. | 439/135 |

FOREIGN PATENT DOCUMENTS

TW 65391 3/1985
TW M291627 6/2006

* cited by examiner

*Primary Examiner*—Thanh-Tam T Le
(74) *Attorney, Agent, or Firm*—Andrew C. Cheng; Wei Te Chung; Ming Chieh Chang

(57) ABSTRACT

An electrical connector (1) for electrically connecting an electronic package with a circuit substrate. The connector includes a housing (11), a fastening device assembled with the housing, and a stiffener (12) surrounding the housing. The stiffener includes a back end (123), and a pair of spaced first walls (125) adjoining the back end. Each first wall has a latch (128) extending upwardly therefrom, and then bends inwardly. The back end has a pair of spaced spring fingers (129) extending substantially horizontally, and then bends slightly upwardly. The latches are fastened to the housing for locating the housing in a vertical direction. The spring fingers abut against the housing for locating the housing in a horizontal direction. The stiffener reinforces the housing, and protects the housing from deformation or warpage.

1 Claim, 3 Drawing Sheets

ELECTRICAL CONNECTOR

BACKGROUND OF THE INVENTION

1. Field of the Invention

The present invention relates to an electrical connector for electrically connecting an electronic package such as a central processing unit (CPU) with a circuit substrate such as a printed circuit board (PCB), and particularly to a land grid array connector having a stiffener for protecting the connector from deformation or warpage.

2. Description of Prior Art

An integrated circuit (IC) package having leads arranged in a land grid array (LGA) is known as an LGA package. LGA packages have relatively low height, which saves valuable space in electronic assemblies.

Connectors for removably mounting an LGA package on a PCB are known as LGA connectors. A conventional LGA connector for electrically connecting an LGA package with a PCB (not shown) comprises a housing, and a fastening device assembled with the housing. The housing has a plurality of passageways (not shown) defined therein. Each passageway has a conductive terminal (not shown) received therein. The fastening device comprises a metal load plate and a lever mounted on opposite sides of the housing respectively. For getting a well fastening performance, the fastening device is usually made of metal materials, which is prone to rust, hence decreasing the effect of the electrical connector. For overcoming this drawback, the fastening device can be made of stainless materials, the price of which is usually higher, hence producing a high cost for producing the electrical connector.

In view of the above, a new land grid array connector assembly that overcomes the above-mentioned disadvantages is desired.

SUMMARY OF THE INVENTION

Accordingly, an object of the present invention is to provide an electrical connector such as a land grid array (LGA) connector assembly for electrically connecting an electronic package such as an LGA central processing unit (CPU) with a circuit substrate such as a printed circuit board (PCB), which can prevent the fastening device assembled in the electrical connector from rust.

To achieve the above-mentioned objects, an electrical connector in accordance with a preferred embodiment of the present invention is for electrically connecting an LGA CPU with a PCB. The connector comprises a housing with a plurality of conductive terminals received therein, a fastening device assembled with the housing. The fastening device comprises a stiffener assembled on a bottom end of the housing, a load plate engaging with a side of the stiffener and pivotally disposed about the housing and a lever mounted on the stiffener. At least of the load plate, the stiffener and the lever is plated on rust proofing layer on a surface thereof, the rust proofing layer comprises a zinc-plating layer and a passivating layer attached on the zinc-plating layer.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
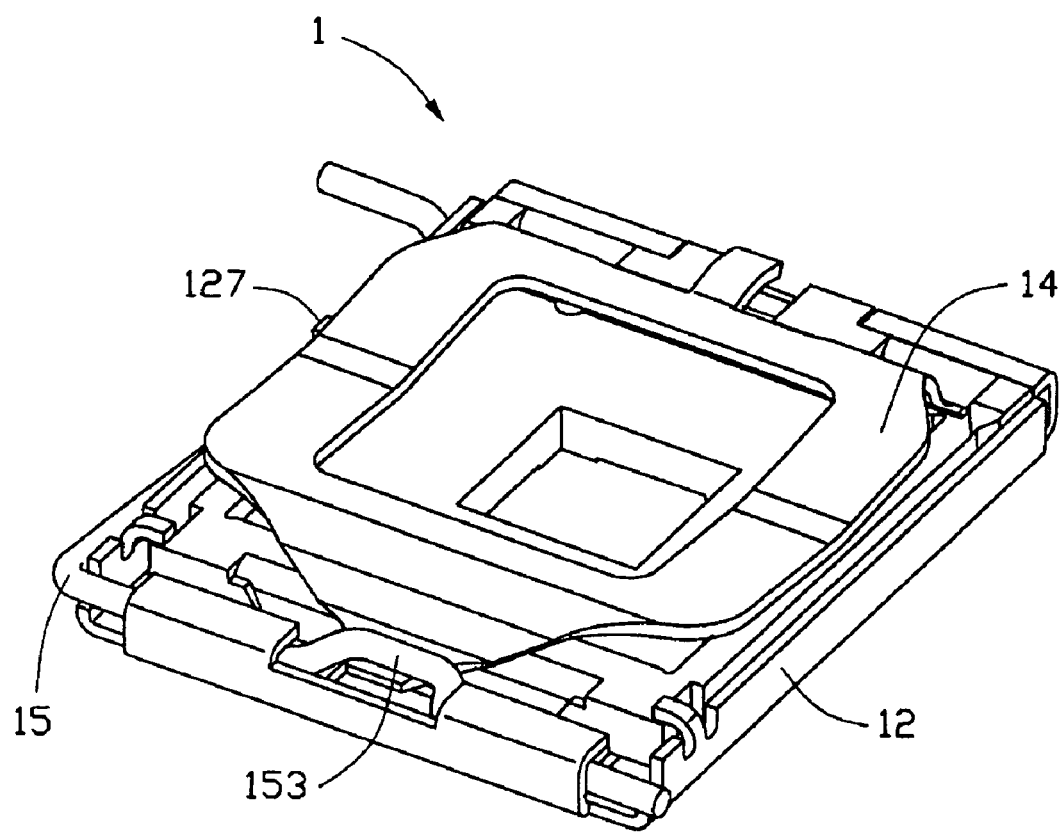
FIG. 1 is an assembled, isometric view of an electrical connector in accordance with the preferred embodiment of the present invention.

Referring to FIG. 1, a land grid array (LGA) connector 10 in accordance with the preferred embodiment of the present invention is for electrically connecting a land grid array (LGA) package (not shown) with a printed circuit board (PCB) (not shown). The connector 10 comprises an insulative housing 11 with a plurality of conductive terminals (not shown) received therein, a fastening device assembled with the housing 11, and a stiffener 12 surrounding the housing 11. The fastening device comprises a metal load plate 14 and a lever 15 mounted on opposite sides of the housing 11 respectively.

Figure 3:
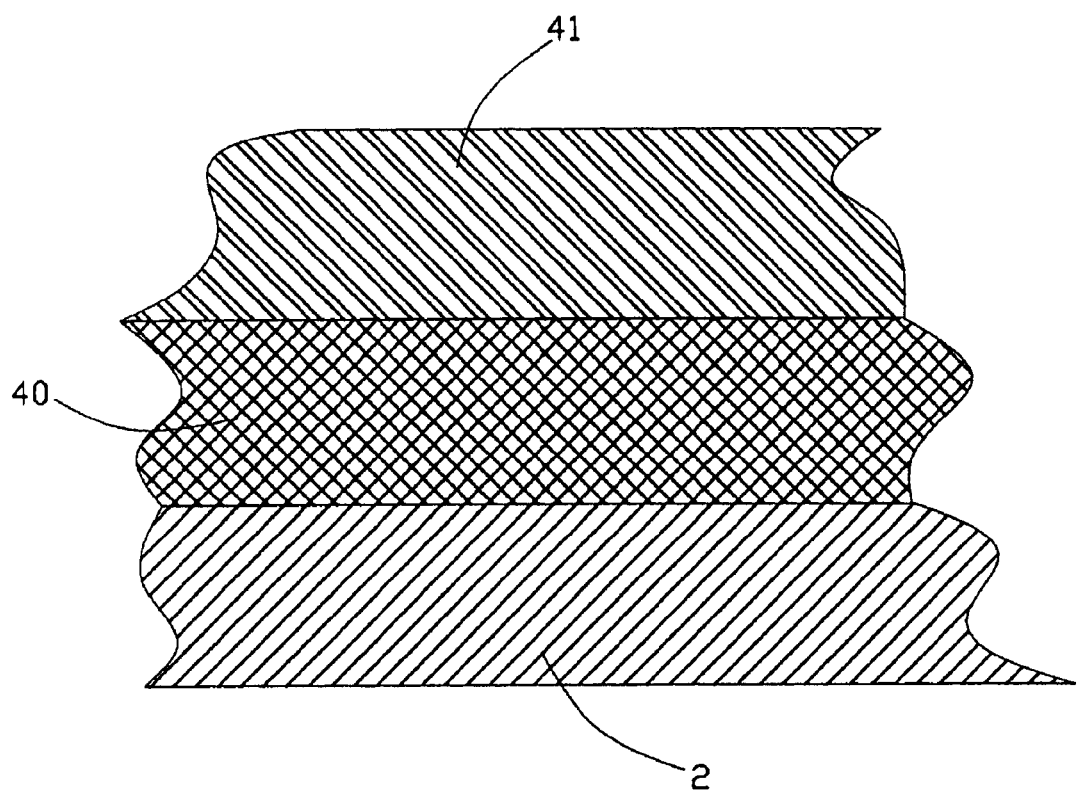
FIG. 3 is a perspective view of a rust proofing layer of one of fastening device.

FIG. 3 shows the housing 11 of the connector 10. The housing 11 is generally rectangular, and comprises a main body 111. A plurality of receiving passageways (not shown) is defined in the main body 11, the receiving passageways receiving corresponding terminals therein. The housing 11 further comprises a head portion 112 extending from a first end (not labeled) of the main body 111, a rear portion 113 extending from a second end (not labeled) of the main body 111 opposite from the head portion, and a pair of opposite side walls (not labeled) respectively interconnecting the head and rear portions 112, 113.

In the embodiment of the invention, the stiffener 12, the load plate 14 and the lever 15 are made of metal materials except the stainless materials, and the surfaces of those materials are plated on the rustproof layers. In addition, the rustproof layers can be choosey plated on one of the stiffener 12, the load plate 14 and the lever 15 made of metal materials, or two of them.

Referring to FIG. 3, the rustproof layer comprises a zinc-plating layer and a passivating layer attached on the zinc-plating layer. The effect of zinc-plating layer is initially rustproof and enhances the degree of finish of the fastening device but it do not provide a higher rustproof capacity of the fastening device, for example in a salt mist circumstance the zinc-plating layer can not pass through the rustproof test, so the passivating layer is further plated on the zinc-plating layer for getting a higher rustproof effect. In the embodiment of the invention, the passivating layer can be made of cadmium plating or nickel plating or other plating made by some inert metal material.

The head portion 112 defines a pair of spaced first retaining slots 1121, and a second retaining slot 1122 between the first retaining slots 1121. A pair of first arcuate retaining surfaces 1123 is defined on the head portion 112 at the corresponding first retaining slots 1121. A second arcuate retaining surface 1124 is defined on the head portion 112 at the second retaining slot 1122. Each side wall (not labeled) of the housing 11 defines a guiding slot 1131 at the rear portion 113. Each guiding slot 1131 runs through an entire height of the corresponding side wall (not labeled).

Figure 2:
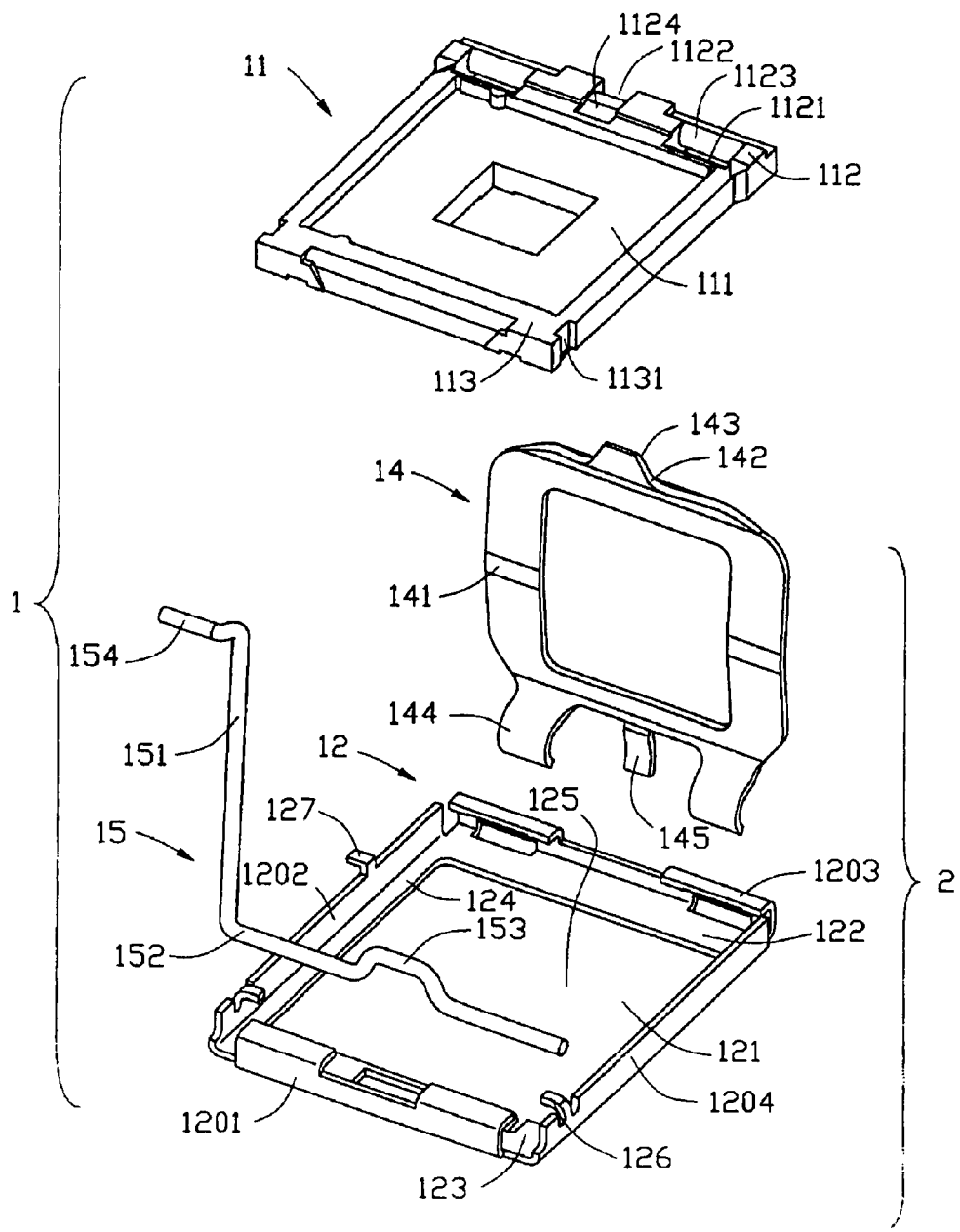
FIG. 2 is an exploded, isometric view of the electrical connector of FIG. 1.

FIG. 2 shows the stiffener 12 of the connector 10. The stiffener 12 is made of strong material, preferably metal. The stiffener 12 comprises a substantially rectangular supporting portion 124. The stiffener 12 has a four sidewalk extending from edges of the supporting portion 124 and a receiving space 125 defined by the four sidewalls, the four sidewalls including a first sidewall 1201 pivotally the level 15, a second sidewall 1203 opposed the first sidewall 1201, a third sidewall 1202 and a fourth sidewall 1204 linking the first and the second sidewalls 1201, 1203. The supporting portion 124 comprises a front end 122 near the first sidewall 1201, a back end 123 near the second sidewall 1203 and opposite to the front end 122, and a pair of lateral sides (not labeled) respectively interconnecting the front and back ends 122, 123. The front and back ends 122, 123, and lateral sides (not labeled) cooperatively define a central opening 121 therebetween.

The stiffener 12 further comprises a pair of latches 126 formed on the third and the forth sidewalls 1202, 1204 respectively near the back end 123. Each latch 126 extends upwardly from the corresponding sidewalls 1202, 1204, and then bends inwardly.

The load plate 14 comprises a pair of first locating portions 144 respectively secured in the first retaining slots 1121 and optionally further freely or supportably extending into the corresponding openings (not labeled) at the corner of the second sidewall 1203 and the front end 122 when the load plate 14 is in a horizontal locking position, and a second locating portion 145 between the first locating portions 144. The load plate 14 further comprises a pair of opposite lateral pressing arms 141, and a driving hook 142 at a free end thereof generally between distal ends of the pressing arms 141. The pressing arms 141 are bent slightly downwardly in a middle thereof. The driving hook 142 has a mating surface 143 defined thereon.

The lever 15 comprises a pair of acting portions 152 respectively and supportably restrained by the first sidewall 1201 and the third sidewall 1202, a driving portion 153 disposed between and offset from the acting portions 151, and a handle portion 151 bent perpendicularly from a distal end of one of the acting portions 152.

Referring to FIGS. 1-2, assembly of the housing 11 with the stiffener 12 is as follows. Firstly, the guiding slots 1131 of the housing 11 are aligned with the corresponding latches 126 of the stiffener 12. Then, the housing 11 is inserted into the receiving space 125 of the stiffener 12. The latches 126 mate in the corresponding guiding slots 1131. Then, the housing 11 is slid toward the front end 122 of the stiffener 12 along the until the head portion 112 of the housing 11 engages with the second sidewall 1203 of the stiffener 12, and a space is defined between the rear portion 113 of the housing 11 and the first sidewall 1201 of the stiffener 12. The second sidewall 1203 locates the head portion 112 of the housing 11 both in a horizontal forward direction and in vertical directions. When the housing 11 is slid away from the back end 123 of the stiffener 12, the latches 128 of the stiffener 12 are fittingly engaged on the top surface 1133 of the rear portion 113 of the housing 11. The rear portion 113 of the housing 11 is thereby located in vertical directions.

FIG. 1 shows the connector 10 fully assembled. The first locating portions 144 of the load plate 14 are movably engaged on the corresponding first retaining surfaces 1123, and the second locating portion 145 of the load plate 14 is movably engaged on the second retaining surface 1124. In use, the load plate 14 is rotated to be perpendicular to the housing 11 in a vertical open position. This enables the LGA package to be attached on the housing 11. In the open position, the handle portion 151 of the lever 15 is horizontal. Then, the load plate 14 is rotated to a substantially horizontal position, with the pressing arms 141 of the load plate 14 resting on the LGA package. The handle portion 151 of the lever 15 is rotated upwardly to be perpendicular to the housing 11. In this position, the driving portion 153 of the lever 15 is received in the driving hook 142, and engages with the mating surface 143 of the driving hook 142. The handle portion 151 of the lever 15 is rotated down toward the load plate 14 until it is locked by a lock 127 formed on the third sidewall 1202. In this position, the lever 15 is at a horizontal closed position, with the driving portion 153 pressing the driving hook 142 of the load plate 14 downwardly. Accordingly, the pressing arms 141 resiliently press the LGA package. Therefore, the LGA package is securely attached on the housing 11, and the conductive pads (not shown) of the LGA package are electrically connected with the terminals of the housing 11 securely.

At the closed position, the pressing arms 141 apply downward forces on middle portions (not labeled) of the housing 11. The first retaining surfaces 1123 of the housing 11 apply downward forces on the first locating portions 144 of the load plate 14, thereby locating the locating portions 144 thereat. The locating portions 144 apply upward counterforces on the retaining surfaces 1123.

The strong, metallic stiffener 12 surrounds the housing 11. The second sidewall 1203 of the stiffener 12 locates the head portion 112 of the housing 11 in a horizontal direction and in vertical directions. The latches 126 of the stiffener 12 locate the rear portion 113 of the housing 11 in vertical directions. Therefore, when the housing 11 is subjected to the above-described downward forces on the middle portion thereof and the upward forces on the head portion 112, the stiffener 12 reinforces the housing 11 and protects the housing 11 from deforming or warpage. Accordingly, reliable electrical connection between the terminals of the connector 10 and the conductive pads of the LGA package can be maintained.

The stiffener 12, the load plate 14 and the lever 15 of the fastening device are made of metal materials except the stainless materials, and the surfaces of them are plated on rustproof materials which prevent the stiffener, the load plate and the lever from rust and provides a securely fastening effect of the fastening device. Besides, the rustproof layer disposed can provide fastening device made of no-stainless metal materials a rustproof effect and decreases the cost thereof.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for electrically connecting an electronic package with a circuit substrate, the electrical connector comprising:

an insulative housing with a plurality of conductive terminals received therein;

a fastening device comprising a stiffener defining a receiving space surrounding the housing and a load plate pivotally attached to a side of the stiffener to cover the housing; and a lever assembled to another side of the stiffener to retain the load plate to the stiffener;

wherein the stiffener and the load plate each has a layer of anti-rusting thereon, the layer comprises a zinc-plating layer and a passivating layer coated on the zinc-plating layer;

wherein the passivating layer is made from chromium material; and wherein the insulative housing has a head portion which defines a pair of spaced first retaining slots, the load plate comprises a pair of first locating portions respectively secured in the first retaining slots.

* * * * *